(12) United States Patent
Hamada et al.

(10) Patent No.: US 9,035,407 B2
(45) Date of Patent: May 19, 2015

(54) RECEIVER MODULE AND DEVICE

(71) Applicant: OCLARO JAPAN, INC., Kanagawa (JP)

(72) Inventors: Hiroshi Hamada, Kanagawa (JP); Takashi Toyonaka, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 13/710,675

(22) Filed: Dec. 11, 2012

(65) Prior Publication Data

US 2013/0147002 A1 Jun. 13, 2013

(30) Foreign Application Priority Data

Dec. 13, 2011 (JP) ................. 2011-272146

(51) Int. Cl.
| | |
|---|---|
| *H01L 31/0232* | (2014.01) |
| *H01L 31/0224* | (2006.01) |
| *H01L 31/02* | (2006.01) |
| *H01L 23/00* | (2006.01) |
| *G02B 6/42* | (2006.01) |

(52) U.S. Cl.
CPC ........ *H01L 31/0224* (2013.01); *H01L 31/0232* (2013.01); *H01L 31/02005* (2013.01); *H01L 31/022408* (2013.01); *G02B 6/4204* (2013.01); *G02B 6/421* (2013.01); *G02B 6/4238* (2013.01); *G02B 6/4274* (2013.01); *G02B 6/4292* (2013.01); *H01L 24/13* (2013.01); *H01L 24/29* (2013.01); *H01L 24/81* (2013.01); *H01L 24/83* (2013.01); *H01L 2224/10145* (2013.01); *H01L 2224/10175* (2013.01); *H01L 2224/1308* (2013.01); *H01L 2224/8338* (2013.01); *H01L 2224/8138* (2013.01); *H01L 24/05* (2013.01); *H01L 24/16* (2013.01); *H01L 24/32* (2013.01); *H01L 2224/0401* (2013.01); *H01L 2224/04026* (2013.01); *H01L 2224/05644* (2013.01); *H01L 2224/131* (2013.01); *H01L 2224/13111* (2013.01); *H01L 2224/13144* (2013.01); *H01L 2224/16227* (2013.01); *H01L 2224/16238* (2013.01); *H01L 2224/26145* (2013.01); *H01L 2224/26175* (2013.01); *H01L 2224/2908* (2013.01); *H01L 2224/291* (2013.01); *H01L 2224/29111* (2013.01); *H01L 2224/29144* (2013.01); *H01L 2224/32227* (2013.01); *H01L 2224/32238* (2013.01); *H01L 2224/81192* (2013.01); *H01L 2224/81203* (2013.01); *H01L 2224/81444* (2013.01); *H01L 2224/83192* (2013.01); *H01L 2224/83203* (2013.01); *H01L 2224/83444* (2013.01); *H01L 2924/3841* (2013.01); *H01L 2224/16225* (2013.01)

(58) Field of Classification Search
USPC ............... 257/431, 81, 432, 98, 99, 678, 118; 438/26, 27, 28, 42
See application file for complete search history.

(56) References Cited

U.S. PATENT DOCUMENTS

| | | | | |
|---|---|---|---|---|
| 5,179,609 A | * | 1/1993 | Blonder et al. .................. | 385/89 |
| 6,506,672 B1 | * | 1/2003 | Dagenais et al. ............. | 438/612 |
| 7,928,635 B2 | * | 4/2011 | Nagano et al. ................ | 310/344 |
| 2007/0181986 A1 | * | 8/2007 | Yokoyama .................... | 257/677 |
| 2008/0151960 A1 | * | 6/2008 | Furushima et al. ........ | 372/50.12 |

FOREIGN PATENT DOCUMENTS

| | | | |
|---|---|---|---|
| JP | 10213723 A | * | 8/1998 |
| JP | 2009-218280 A | | 9/2009 |

* cited by examiner

*Primary Examiner* — Yu-Hsi D Sun
*Assistant Examiner* — Christina Sylvia
(74) *Attorney, Agent, or Firm* — Mattingly & Malur, PC (57) ABSTRACT

Provided is a receiver module, including: a semiconductor light receiving element including an electrode; and a submount including: an electrical wiring joined to the electrode with solder; and a trap region arranged around a joining surface of the electrical wiring, the trap region retaining solder by solder wetting.

10 Claims, 11 Drawing Sheets

RECEIVER MODULE AND DEVICE

CROSS-REFERENCE TO RELATED APPLICATION

The present application claims priority from Japanese application JP2011-272146 filed on Dec. 13, 2011, the content of which is hereby incorporated by reference into this application.

BACKGROUND OF THE INVENTION

1. Field of the Invention

The present invention relates to a device employing solder joining. In particular, the present invention relates to a receiver module in which a device employing solder joining is mounted.

2. Description of the Related Art

There is known a receiver module in which a device is mounted, the device including a semiconductor light receiving element and a sub-mount which are joined to each other with solder.

For example, Japanese Patent Application Laid-open No. 2009-218280 describes a technology relating to a receiver module in which the solder wetting area for joining the semiconductor light receiving element to the sub-mount with solder is relatively reduced (solder wetting and spreading is suppressed), to thereby improve the accuracy of a mounting position of a semiconductor chip and also prevent generation of solder balls.

SUMMARY OF THE INVENTION

Figure 8:
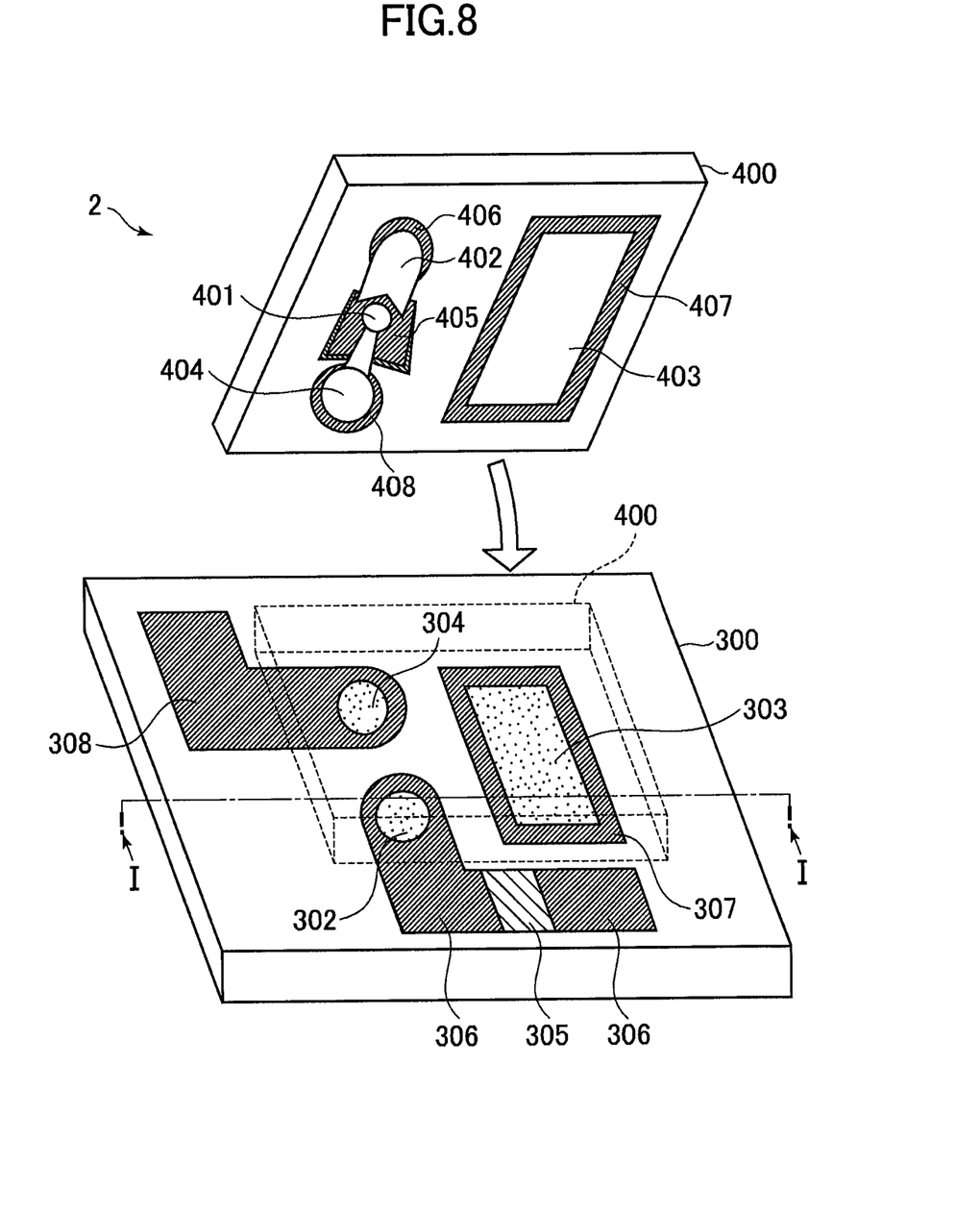
FIG. 8 is a schematic view of a receiver module of a previously studied technology that has been studied prior to this application by the inventors of this application and others.

FIG. 8 is a schematic view of a receiver module of a previously studied technology that has been studied prior to this application by the inventors of this application and others. FIG. 8 illustrates a state in which a sub-mount 300 and a semiconductor light receiving element 400 of a receiver module 2 are joined to each other with solder. As illustrated in FIG. 8, the sub-mount 300 includes a damping resistor 305, and electrical wirings 306 to 308 each made of a metal such as Au.

The semiconductor light receiving element 400 includes a light receiving portion 401, an N-type electrode pad 402, a dummy electrode pad 403, a P-type electrode pad 404, and mesa portions 405 to 408. On the electrical wirings 306 to 308, an N-type electrode solder portion 302, a dummy electrode solder portion 303, and a P-type electrode solder portion 304 (hereinafter also collectively and simply referred to as "solder portion") are arranged, respectively. The solder portion contains a gold-tin (AuSn) solder material or other solder materials.

Figure 9:
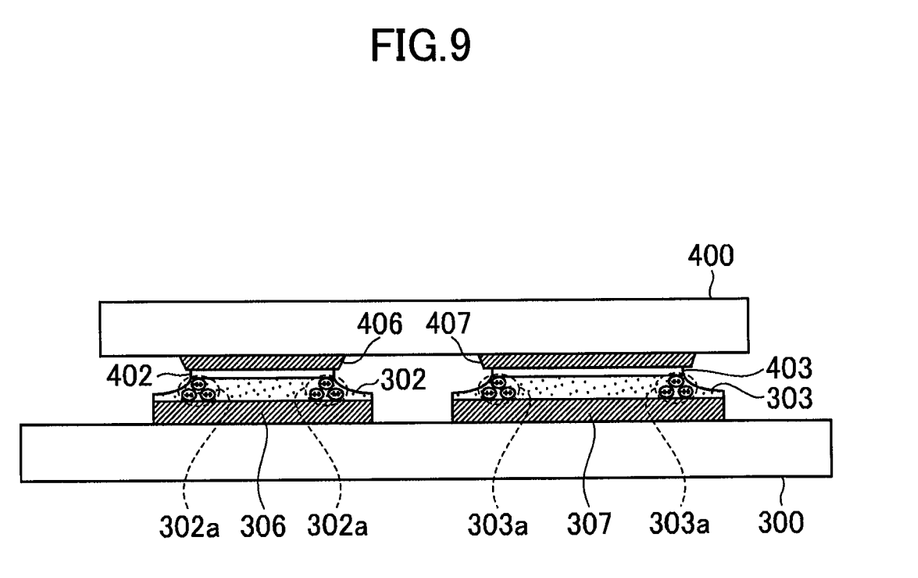
FIG. 9 is a sectional view taken along the line I-I of FIG. 8 when a semiconductor light receiving element is joined to a sub-mount with solder.

FIG. 9 is a sectional view taken along the line I-I of FIG. 8 when the semiconductor light receiving element 400 is joined to the sub-mount 300 with solder. As illustrated in FIG. 9, the sub-mount 300 and the semiconductor light receiving element 400 are joined to each other by press-fitting through intermediation of a melted solder material. In this case, when the solder material melts, the solder material reacts with the electrical wirings 306 to 308, and hence a metal segregated part may be generated in the solder portion.

For example, as illustrated in FIG. 9, in the N-type electrode solder portion 302 and the dummy electrode solder portion 303, Au-rich parts 302a and 303a may be formed, respectively, in which the ratio of Au is partially high. The Au-rich parts 302a and 303a have a melting point higher than other parts of the solder material, and hence the Au-rich parts 302a and 303a may insufficiently melt, and the solder wetting area (wetting and spreading) may become insufficient. Regarding this point, there is also known a technology of preventing insufficiency of the solder wetting area by avoiding direct contact between the solder portion and the electrical wiring.

Figure 10:
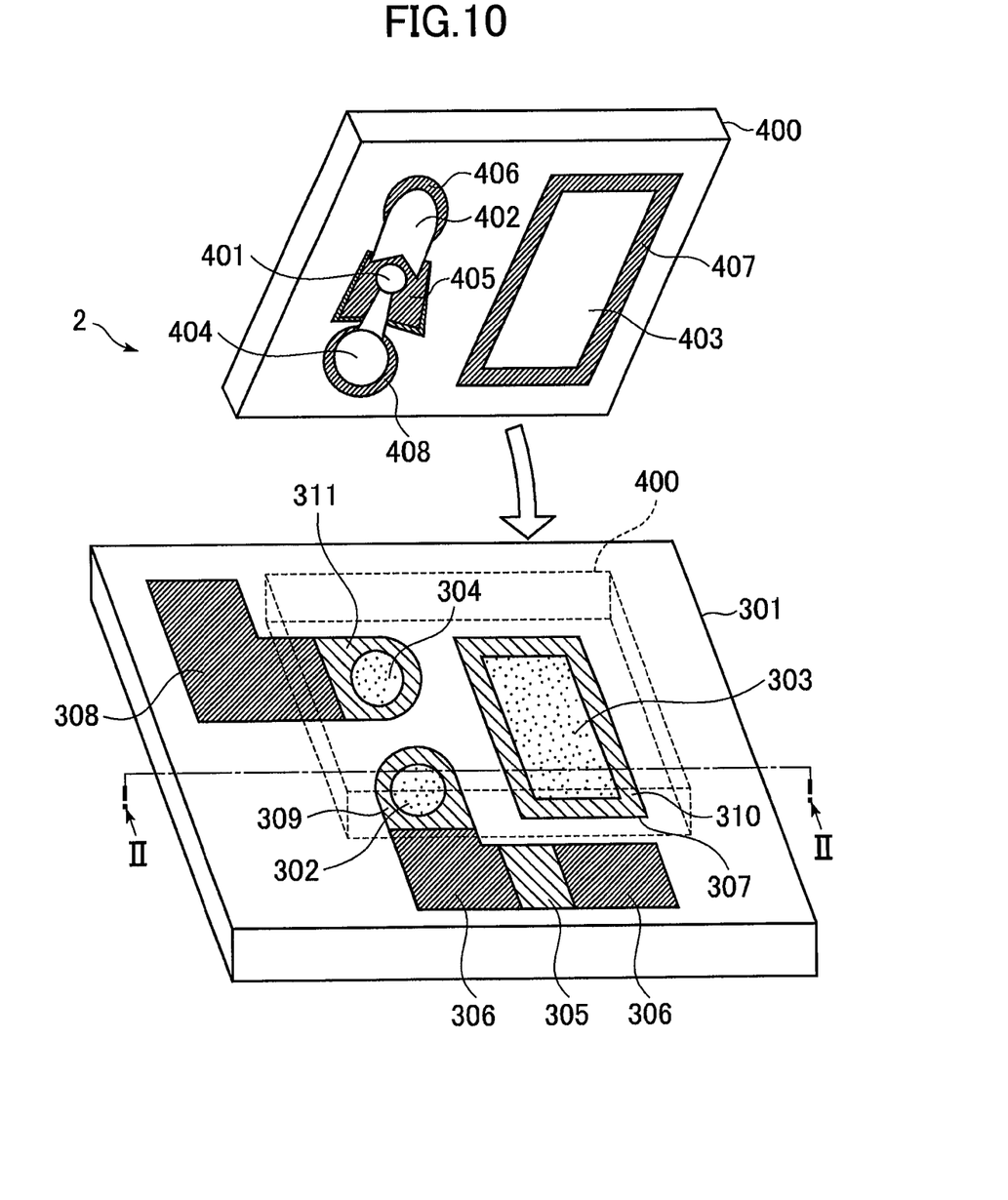
FIG. 10 is a view illustrating an example of a receiver module of another previously studied technology that has been studied prior to this application by the inventors of this application and others, the receiver module being configured to avoid direct contact between a solder portion and electrical wiring.

FIG. 10 is a view illustrating an example of a receiver module of another previously studied technology that has been studied prior to this application by the inventors of this application and others, the receiver module being configured to avoid direct contact between the solder portion and the electrical wirings 306 to 308. As illustrated in FIG. 10, on regions of the electrical wirings 306 to 308, which include joining surfaces with respect to the semiconductor light receiving element 400, barrier metal portions 309 to 311 are formed, respectively, so as to avoid direct contact between the solder portion and the electrical wirings (that is, so as to avoid reaction between the solder material and the electrical wirings). When the electrical wirings 306 to 308 are covered with the barrier metal portions 309 to 311, respectively, as described above, the solder material is not brought into direct contact with the electrical wirings 306 to 308. As a result, generation of an Au-rich part can be prevented, and the insufficiency of the solder wetting area can be prevented.

However, in the previously studied technology, when the solder material for joining the semiconductor light receiving element and the sub-mount to each other flows out from the bonding surface, the electrodes of the semiconductor light receiving element may be short-circuited to cause operation failure. Particularly in receiver modules of recent years, a semiconductor light receiving element that is capable of responding at high speed has been adopted. In such a semiconductor light receiving element, the electrode and the light receiving portion are provided close to each other to reduce the wiring capacitance. The inventors of this application and others have found a problem in that, because of this, there is a higher possibility of short-circuit between the electrodes of the semiconductor light receiving element due to the outflowing solder material.

For example, the semiconductor light receiving element as described above is designed in many cases so that, as for the element outer shape having the size of about 300 micrometer square, the electrodes of the semiconductor light receiving element each have a diameter of about 50 to 80 micrometers. Those electrodes are provided close to each other, and hence when the solder portion melts, there is a higher possibility of short-circuit between the electrodes due to the outflowing solder material.

Figure 11:
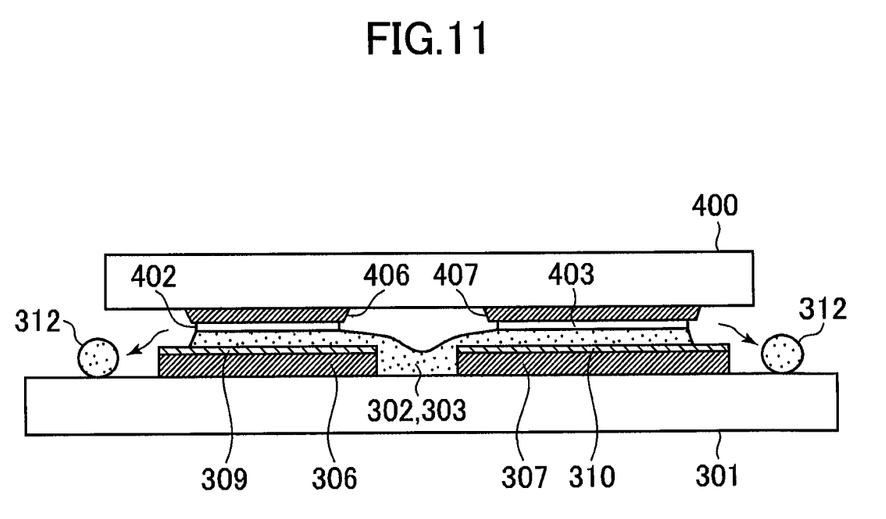
FIG. 11 is a sectional view taken along the line II-II of FIG. 10, which illustrates an example of the problem of the previously studied technology.

FIG. 11 is a sectional view taken along the line II-II of FIG. 10, which illustrates an example of the problem of the previously studied technology. As illustrated in FIG. 11, for example, the N-type electrode pad 402 and the dummy electrode pad 403 are provided close to each other, and hence short-circuit may occur between the electrodes due to the outflowing solder material. Further, when the solder material leaks outside the semiconductor light receiving element 400, solder balls 312 may be generated, which may cause wiring short-circuit.

Regarding this point, it is conceivable to define the amount of the solder material in accordance with the thicknesses of the sub-mount and the semiconductor light receiving element or the surface area of each electrode, thereby controlling the protruding amount of the solder material. However, when the amount of the solder material is too small, the solder wetting area may become insufficient. It has been difficult to prevent the short-circuit of the receiver module merely by adjusting the amount of the solder material.

The present invention has been made in view of the above-mentioned problems, and has an object to provide a receiver module and a device, which are capable of reliably preventing short-circuit due to solder.

In order to solve the above-mentioned problems, according to an exemplary embodiment of the present invention, there is provided a receiver module, including: a semiconductor light receiving element including an electrode; and a sub-mount including: an electrical wiring joined to the electrode with solder; and a trap region arranged around a joining surface of the electrical wiring, the trap region retaining solder by solder wetting.

Further, in another exemplary embodiment of the present invention, the sub-mount further includes a barrier metal arranged between the joining surface and the trap region. The joining surface of the electrical wiring is surrounded by the barrier metal.

Further, instill another exemplary embodiment of the present invention, the trap region contains a metal to be reacted with solder to be alloyed.

Further, in yet another exemplary embodiment of the present invention, the electrode has a surface containing Au as a main component. The solder is AuSn-based solder. The trap region has a surface containing Au.

Further, in yet another exemplary embodiment of the present invention, the barrier metal has a surface containing one of Pt and Pd.

Further, in yet another exemplary embodiment of the present invention, the semiconductor light receiving element includes a plurality of electrodes. The sub-mount includes a plurality of electrical wirings. Each of the plurality of electrodes is joined to corresponding one of the plurality of electrical wirings with solder. The trap region is arranged around each of the plurality of electrical wirings to retain melted solder when the plurality of electrodes and the plurality of electrical wirings are joined to each other, thereby preventing joining between the plurality of electrodes and joining between the plurality of electrical wirings due to the melted solder.

Further, in yet another exemplary embodiment of the present invention, the barrier metal prevents segregation of solder which occurs when the electrode and the electrical wiring are joined to each other.

Further, according to an exemplary embodiment of the present invention, there is provided a receiver module, including: a sub-mount including an electrical wiring; and a semiconductor light receiving element including: an electrode joined to the electrical wiring with solder; and a trap region arranged around the electrode, the trap region retaining solder by solder wetting.

Further, in another exemplary embodiment of the present invention, the sub-mount further includes a trap region around the electrical wiring, the trap region retaining solder by solder wetting.

Further, in still another exemplary embodiment of the present invention, the electrode of the semiconductor light receiving element has a surface layer containing Au. The electrical wiring of the sub-mount is joined to the electrode with AuSn-based solder. The trap region of the sub-mount has a surface layer containing Au.

Further, in yet another exemplary embodiment of the present invention, the sub-mount further includes a barrier metal arranged between the joining surface and the trap region so as to surround the joining surface, the barrier metal having a surface layer containing one of Pt and Pd.

Further, in yet another exemplary embodiment of the present invention, the receiver module further includes: an optical fiber for passing light from outside; a lens for causing the light that has passed through the optical fiber to enter the receiver module; and a lead pin for outputting a signal that has been photoelectrically converted by the receiver module.

Further, according to an exemplary embodiment of the present invention, there is provided a device, including: an element including an electrode having a surface layer containing Au; and a wiring board including: an electrical wiring joined to the electrode with AuSn-based solder; and a trap region provided around a joining surface of the electrical wiring, the trap region having a surface layer containing Au.

Further, in another exemplary embodiment of the present invention, the wiring board further includes a barrier metal arranged between the joining surface and the trap region so as to surround the joining surface, the barrier metal having a surface layer containing one of Pt and Pd.

DETAILED DESCRIPTION OF THE INVENTION

In the following, a device employing solder joining according to the present invention is described in detail with reference to the drawings by means of an embodiment of a receiver module as an example.

Figure 1:
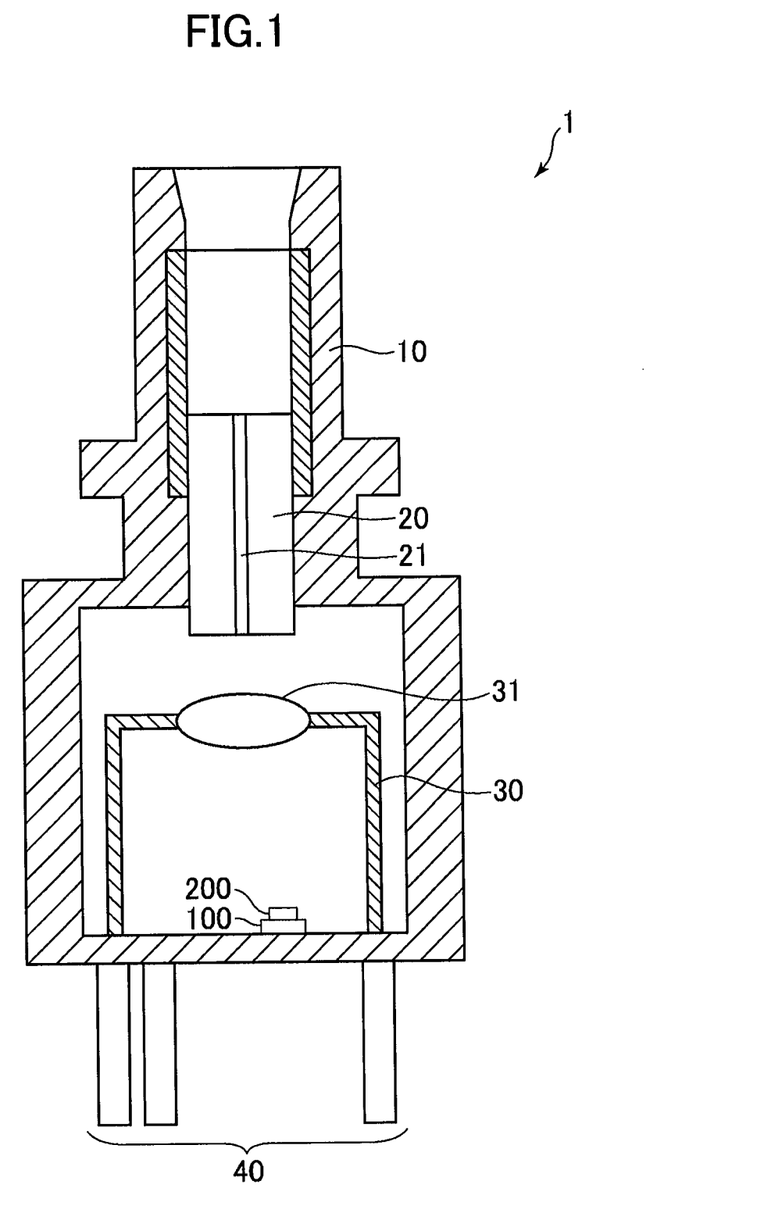
FIG. 1 is a schematic sectional view illustrating an example of a schematic configuration of a receiver module according to an embodiment of the present invention.

FIG. 1 is a schematic sectional view illustrating an example of a schematic configuration of the receiver module according to the embodiment of the present invention. A receiver module 1 according to this embodiment includes an overall housing portion 10, an optical fiber 21 for passing light from the outside, a lens 31 for causing light that has passed through the optical fiber 21 to enter a semiconductor light receiving element 200, a lead pin 40 for outputting a signal that has been photoelectrically converted by the semiconductor light receiving element 200, a sub-mount 100, and the semiconductor light receiving element 200.

The overall housing portion 10 is a metallic member for holding the respective members of the receiver module 1, and includes an optical fiber housing portion 20 and a lens housing portion 30. The optical fiber housing portion 20 is a metallic cylindrical member for holding the optical fiber 21. The optical fiber 21 including a connector is inserted from outside into the optical fiber housing portion 20. The lens housing portion 30 has a hole formed at a predetermined position, into which the lens 31 is fitted, and the lens housing portion 30 supports the lens 31.

Further, at a position of the overall housing portion 10 on an inner side of its bottom surface (surface to which the lead pin 40 is connected), the position being offset from the central axis, the sub-mount 100 is mounted, which is made of aluminum nitride or the like and on which high-frequency signal lines are printed. On the sub-mount 100, the semiconductor light receiving element 200 is mounted, which is formed of a photodiode and the like and is configured to receive light that has passed through the optical fiber 21 and the lens 31 and photoelectrically convert an optical signal corresponding to the light into an electrical signal.

Note that, although not particularly shown, on the inner side of the bottom surface of the overall housing portion 10, amounting element such as a preamplifier is mounted. The mounting element, the sub-mount 100, and the semiconductor light receiving element 200 are electrically connected to a flexible substrate (not shown) via the lead pin 40, the flexible substrate being provided outside the receiver module 1. The lead pin 40 is connected from the outer side of the bottom surface of the overall housing portion 10. Electrical signals output from the semiconductor light receiving element 200 and the mounting element are transmitted to the flexible substrate via the lead pin 40.

Figure 2:
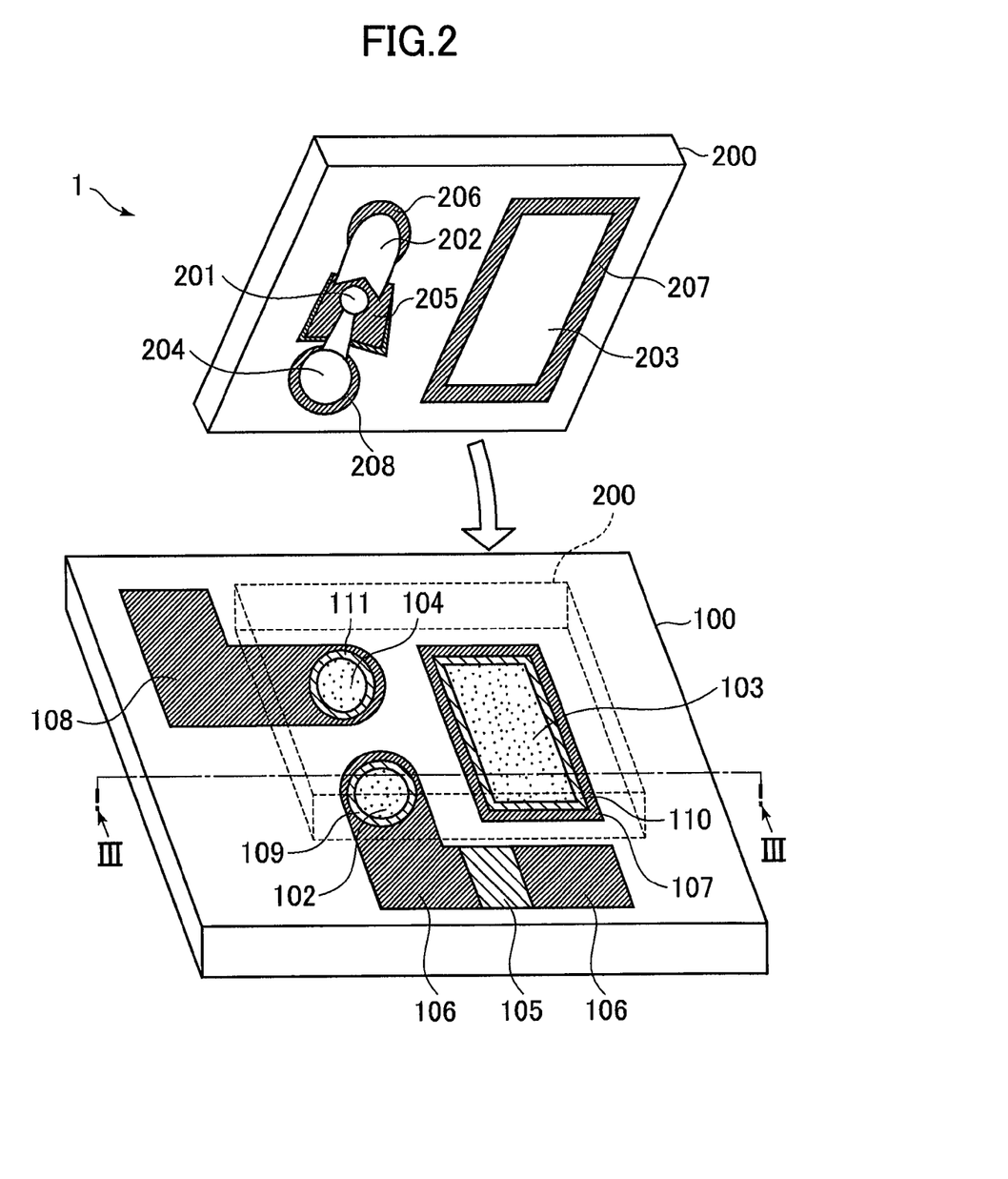
FIG. 2 is a schematic view of the receiver module according to the embodiment of the present invention.

FIG. 2 is a schematic view of the receiver module according to the embodiment of the present invention. FIG. 2 illustrates states before and after the joining between the semiconductor light receiving element 200 including an electrode having a surface layer containing Au and the sub-mount 100 (mounting member) including electrical wiring to be joined to the electrode with solder. In this case, the electrode surface has Au as a main component, and the solder is AuSn-based solder.

The semiconductor light receiving element 200 includes a plurality of electrodes (electrodes for operating a light receiving portion 201, which correspond to three electrodes of an N-type electrode pad 202, a dummy electrode pad 203, and a P-type electrode pad 204). The sub-mount 100 includes a plurality of electrical wirings 106 to 108. Those plurality of electrodes are joined to corresponding one of the plurality of electrical wirings 106 to 108 with solder. In this case, the three electrical wirings 106 to 108 corresponding to the three electrodes are arranged.

Further, the sub-mount 100 includes barrier metals 109 to 111 for preventing solder segregation that occurs when the electrodes and the electrical wirings are joined to each other. The barrier metals 109 to 111 are arranged between the solder and the electrical wirings 106 to 108 (joining surfaces), respectively. As illustrated in FIG. 2, the barrier metals 109 to 111 are arranged on respective joining surfaces at which the electrical wirings 106 to 108 are joined to the N-type electrode pad 202, the dummy electrode pad 203, and the P-type electrode pad 204, respectively. That is, the barrier metals 109 to 111 surround the joining surfaces of the electrical wirings 106 to 108, respectively.

Between the barrier metal 109 and the N-type electrode pad 202, between the barrier metal 110 and the dummy electrode pad 203, and between the barrier metal 111 and the P-type electrode pad 204, solder portions made of AuSn-based solder (for example, an N-type electrode solder portion 102, a dummy electrode solder portion 103, and a P-type electrode solder portion 104) are arranged. The surface of each of the barrier metals 109 to 111 contains platinum (Pt) or palladium (Pd). In this case, the barrier metals 109 to 111 each made of titanium/platinum (Ti/Pt), titanium/palladium (Ti/Pd), or the like, which is less liable to react with the solder material, are arranged. In this manner, the solder material and the electrical wirings 106 to 108 are not brought into direct contact with each other, and hence generation of a metal segregated part can be prevented.

Further, in the receiver module 1 according to the present invention, around the respective joining surfaces of the plurality of electrical wirings 106 to 108 to which the electrodes are joined, there are provided trap regions for retaining solder by solder wetting. The trap regions retain melted solder when the plurality of electrodes and the plurality of electrical wirings 106 to 108 are joined to each other. The trap regions prevent joining between the plurality of electrodes and joining (short-circuit) between the plurality of electrical wirings 106 to 108 due to the melted solder. In this case, the trap region is arranged around the surface of each of the electrical wirings 106 to 108, which is covered with the corresponding one of the barrier metals 109 to 111. The trap region contains a metal which is to be reacted with solder to be alloyed, and the surface thereof contains Au. The trap region having a surface layer containing Au is formed of a layer of, for example, Ti/Pt/Au or Ti/Pd/Au.

Figure 3:
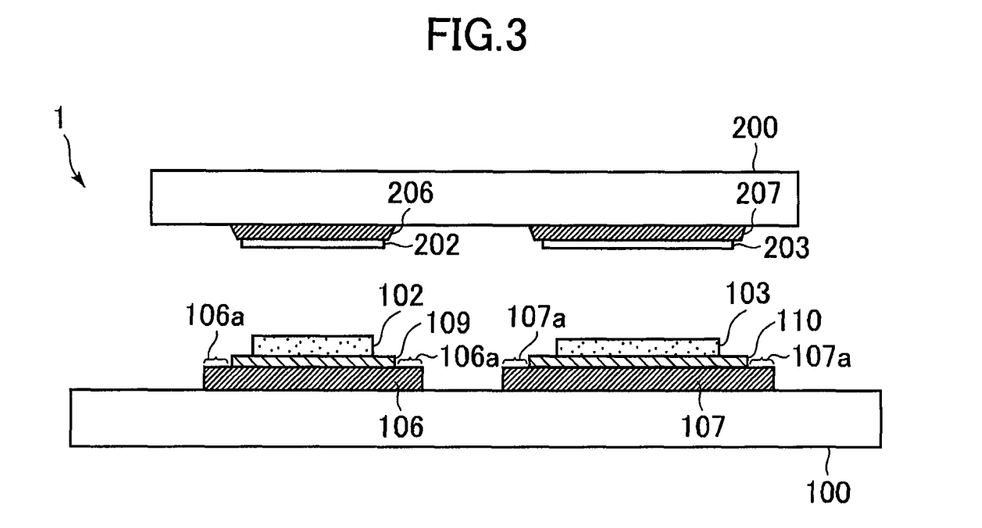
FIG. 3 is a sectional view taken along the line III-III of FIG. 3 before a semiconductor light receiving element is joined to a sub-mount with solder.

FIG. 3 is a sectional view taken along the line of FIG. 2 before the semiconductor light receiving element 200 is joined to the sub-mount 100 with solder. As illustrated in FIG. 3, trap regions 106a and 107a are arranged between the plurality of electrodes (for example, between the N-type electrode pad 202 and the dummy electrode pad 203). The trap regions 106a and 107a prevent joining between the plurality of electrodes and joining between the plurality of electrical wirings 106 and 107 due to the melted solder.

As illustrated in FIG. 3, the trap regions 106a and 107a are provided so as to surround a contact surface at which the electrical wiring 106 and the N-type electrode pad 202 are brought into contact with each other and a contact surface at which the electrical wiring 107 and the dummy electrode pad 203 are brought into contact with each other, respectively. The barrier metal 109 is arranged between the joining surface of the electrical wiring 106 and the trap region 106a. The barrier metal 110 is arranged between the joining surface of the electrical wiring 107 and the trap region 107a. In this case, as illustrated in FIG. 3, the barrier metals 109 and 110 are arranged so as to surround the joining surfaces of the electrical wirings 106 and 107, respectively. The trap regions 106a and 107a are regions of the electrical wirings 106 and 107, which are not covered with the barrier metals 109 and 110, respectively (exposed regions). The trap regions 106a and 107a are regions for retaining, by solder wetting, an excess, outflowing solder material by bringing the excess, outflowing solder material and the metals of the electrical wirings 106 and 107 into direct contact with each other.

In other words, each of the barrier metals 109 and 110 has a surface on a side to be opposed to the semiconductor light receiving element 200, which is smaller than a surface of each of the electrical wirings 106 and 107 on a side to be opposed to the semiconductor light receiving element 200. The trap regions 106a and 107a are arranged around the surfaces of the electrical wirings 106 and 107, which are covered with the barrier metals 109 and 110, respectively.

Further, as illustrated in FIG. 3, in the receiver module 1 according to this embodiment, the semiconductor light receiving element 200 is present beyond the trap regions 106a and 107a. That is, when the receiver module 1 is viewed from above (viewed in a direction normal to the joining surface), the trap regions 106a and 107a are present on the inner side of the semiconductor light receiving element 200.

Figure 4:
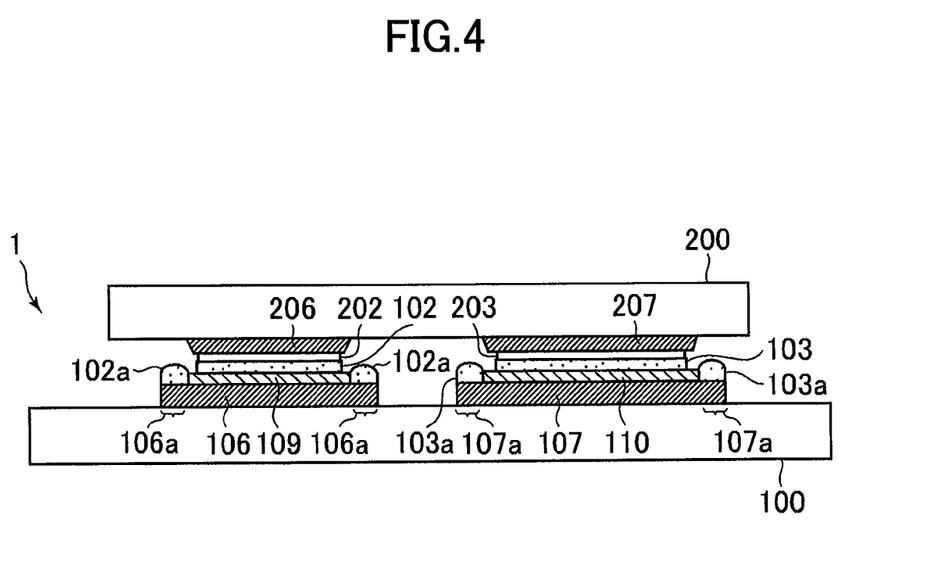
FIG. 4 is a sectional view taken along the line III-III of FIG. 3 after the semiconductor light receiving element is joined to the sub-mount with solder.

FIG. 4 is a sectional view taken along the line III-III of FIG. 3 after the semiconductor light receiving element 200 is joined to the sub-mount 100 with solder. The solder material of the N-type electrode solder portion 102 and the dummy electrode solder portion 103 is melted by heating of the assembly facility, and is pressed and spread by pressurizing the semiconductor light receiving element 200. As illustrated in FIG. 4, the pressed and spread solder material is wetted and spread on the joining surfaces of the N-type electrode pad 202 and the dummy electrode pad 203.

The surfaces (joining surfaces) of the N-type electrode pad 202 and the dummy electrode pad 203 on the side to be opposed to the sub-mount 100 are covered with the barrier metals 109 and 110, respectively, and hence the solder material and the electrical wirings 106 and 107 are not brought into direct contact with each other. Therefore, it is possible to prevent segregation caused by reaction between the solder material and the electrical wirings 106 and 107. The segregation of Au of the solder material is not caused, and hence a part having a high melting point is not generated, and thus the solder material can be wetted and spread evenly over the N-type electrode pad 202 and the dummy electrode pad 203.

Further, the semiconductor light receiving element 200 is pressurized, and hence an excess solder material may flow out from the joining positions. However, in the receiver module 1 according to this embodiment, the surfaces of the electrical wirings 106 and 107 are not completely covered with the barrier metals 109 and 110, respectively, and the trap regions 106a and 107a in which the Au-parts of the electrical wirings 106 and 107 are exposed are present. Therefore, excess, outflowing solder 102a and 103a can be retained by solder wetting. That is, the excess solder material is trapped at the trap regions 106a and 107a by solder wetting and spreading at the time of joining, and hence short-circuits between the electrical wirings and between the electrodes can be prevented.

As described above, in the receiver module 1 according this embodiment, the Au-parts of the trap regions 106a and 107a (parts in which the electrical wirings 106 and 107 are exposed) are arranged on the lower side of the semiconductor light receiving element 200. As a result, the excess, outflowing solder material is pressed against the trap regions 106a and 107a. In this manner, the excess solder material can be reliably trapped, and thus short-circuit due to the solder can be reliably prevented. That is, occurrence of short-circuit between the electrodes and generation of solder balls can be prevented. Further, in the solder material trapped at the trap regions 106a and 107a, an Au-rich part may be generated, but the N-type electrode pad 202 and the dummy electrode pad 203 are joined in regions covered with the barrier metals 109 and 110, respectively, and hence it is also possible to prevent insufficiency of the solder wetting area.

Note that, the present invention is not limited to the above-mentioned embodiment, and may be appropriately modified without departing from the gist of the present invention. For example, in the above-mentioned embodiment, the trap region for trapping the excess solder material is provided on the sub-mount 100 side, but the trap region may be provided also on the semiconductor light receiving element 200 side. That is, the trap region may be provided on both of the semiconductor light receiving element and the sub-mount.

Figure 5:
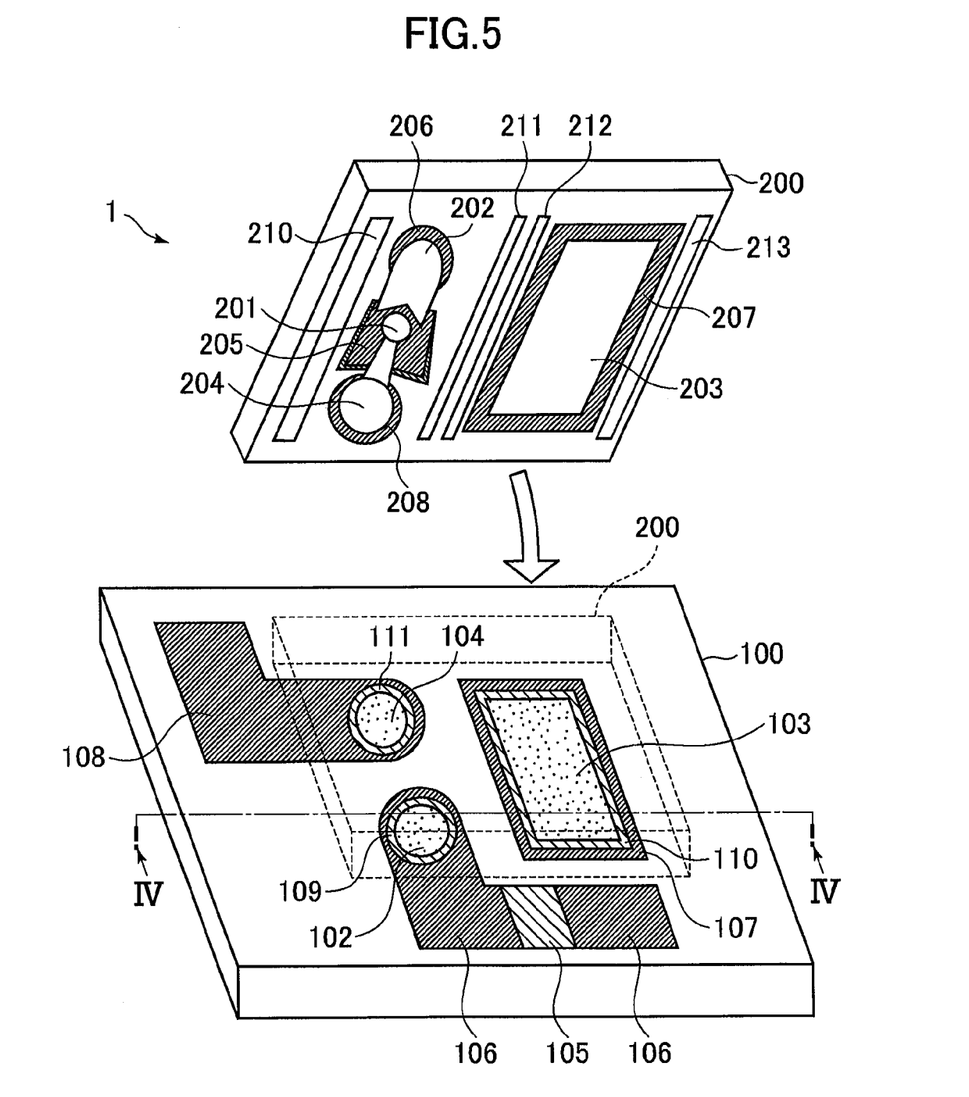
FIG. 5 is a schematic view of a receiver module according to a modified example of the embodiment of the present invention.

FIG. 5 is a schematic view of a receiver module according to a modified example of the embodiment of the present invention. Description of portions of a receiver module 1 of FIG. 5 which are denoted by the same reference symbols as those of configurations that have been already described with reference to FIG. 2 is omitted. As illustrated in FIG. 5, in the modified example, the semiconductor light receiving element 200 includes trap regions 210 to 213 for retaining solder by solder wetting around the electrodes to which the electrical wirings are joined with solder (positions separated from end portions of the electrodes by predetermined distances). Those trap regions 210 to 213 prevent joining of the electrodes to members other than the electrical wirings with melted solder by retaining the melted solder when the electrodes and the electrical wirings are joined to each other.

For example, the trap regions 210 to 213 each contain a metal such as Au. The trap regions 210 and 213 are each arranged between the electrode and an end portion of the semiconductor light receiving element 200, and trap an excess solder material flowing out toward outside of the semiconductor light receiving element 200, to thereby prevent generation of solder balls. On the other hand, the trap regions 211 and 212 are arranged between the electrodes, and trap an excess solder material flowing out toward an electrode different from an electrode to be joined, to thereby prevent short-circuit between the electrodes.

Figure 6:
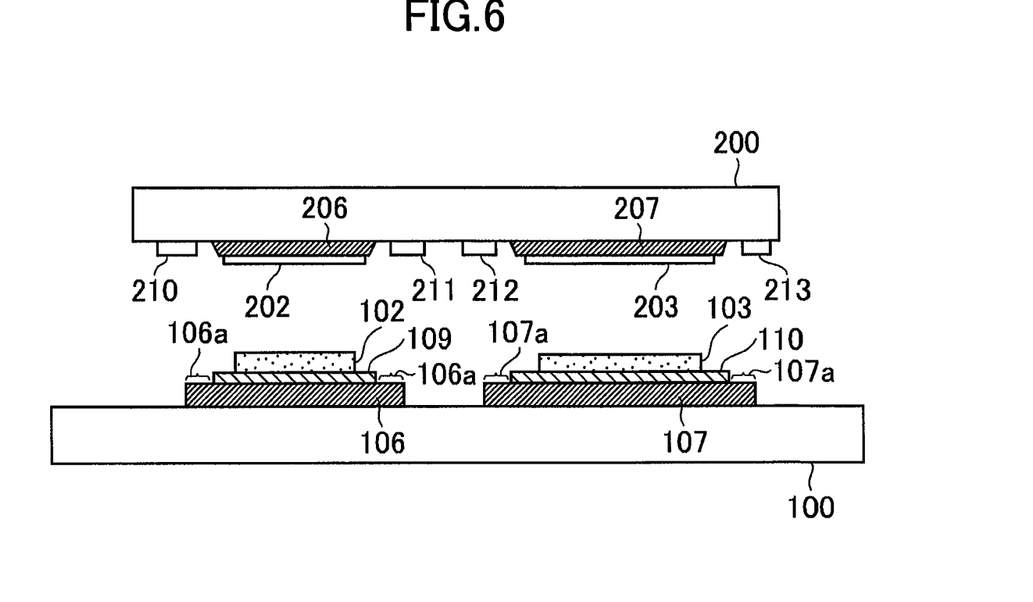
FIG. 6 is a sectional view taken along the line IV-IV of FIG. 5 before a semiconductor light receiving element illustrated in FIG. 5 is joined to a sub-mount.

FIG. 6 is a sectional view taken along the line IV-IV of FIG. 5 before the semiconductor light receiving element 200 illustrated in FIG. 5 is joined to the sub-mount 100. As illustrated in FIG. 6, the trap regions 210 and 211 are arranged around the N-type electrode pad 202, and the trap regions 212 and 213 are arranged around the dummy electrode pad 203.

For example, the trap regions 210 and 211 are arranged at positions opposed to the trap region 106a on the sub-mount 100 side, and the trap regions 212 and 213 are arranged at positions opposed to the trap region 107a on the sub-mount 100 side. In other words, the trap regions 210 and 211 are arranged on straight lines extended from end portions of the electrical wiring 106 toward the semiconductor light receiving element 200, and the trap regions 212 and 213 are arranged on straight lines extended from end portions of the electrical wiring 107 toward the semiconductor light receiving element 200.

Figure 7:
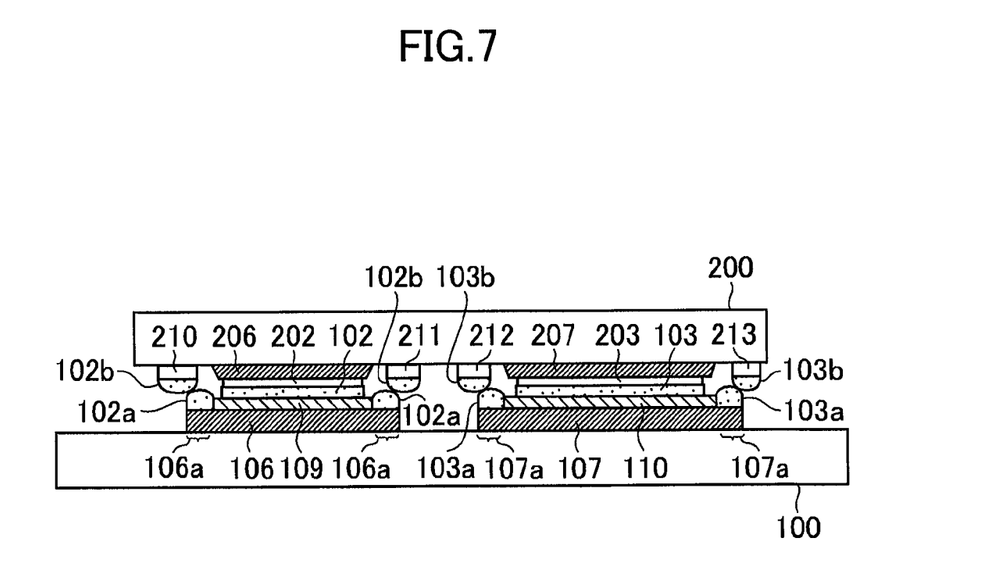
FIG. 7 is a sectional view taken along the line IV-IV of FIG. 5 after the semiconductor light receiving element is joined to the sub-mount with solder.

FIG. 7 is a sectional view taken along the line IV-IV of FIG. 5 after the semiconductor light receiving element 200 is joined to the sub-mount 100 with solder. Similarly to the above-mentioned embodiment, when the semiconductor light receiving element 200 and the sub-mount 100 are joined to each other, the solder material is melted by heating of the assembly facility. When the semiconductor light receiving element 200 is pressurized, an excess solder material may scatter in the periphery, but at least one of the trap region on the sub-mount 100 side and the trap region on the semiconductor light receiving element 200 side can trap the excess solder.

That is, in the modified example, the trap regions 210 to 213 are arranged also on the semiconductor light receiving element 200 side, and even when there is generated an excess solder material that cannot be trapped by the trap regions 106a and 106b on the sub-mount 100 side, the excess solder material can be reliably trapped (excess solder 102b and 103b illustrated in FIG. 7). In this manner, short-circuit between the electrodes can be prevented. Further, when the trap regions 210 and 213 and the electrodes are spaced apart from each other (separated from each other by predetermined distances), it is also possible to prevent increase in floating capacitance.

Note that, in the modified example, description is given of the case where the trap region is provided on both of the sub-mount 100 and the semiconductor light receiving element 200, but the trap region may be provided on only one of those members.

Further, in the above-mentioned embodiment and modified example, description is given of the case where the solder portion is made of AuSn, the electrical wiring is made of Au, and the barrier metal is made of Ti/Pt or Ti/Pd, but various known materials are applicable to those metals of the respective members. Further, description is given of the case where the surface of the trap region contains Au, but it is only required that a metal that can trap the excess solder material (that is, a metal to be reacted with the solder material to be alloyed) be applied as the metal contained in the trap region.

Further, the present invention is generally applicable to cases where the solder portion is made of AuSn-based solder. The AuSn-based solder referred to herein means not only an alloy of Au and Sn, but also a solder layer formed by multi-layering Au layers and Sn layers alternately. Further, description is given of the case where the barrier metal has a surface containing Pt or Pd, but the barrier metal is applicable in the present invention as long as the barrier metal is a metal that does not react with AuSn-based solder. The example of AuSn-based solder is described above, but the spirit of the present invention is also applicable to other solder.

Further, description is given of the trap region for preventing short-circuit between the N-type electrode pad 202 and the dummy electrode pad 203, but similarly to the above-mentioned embodiment and modified example, other electrodes may be provided with the trap region for trapping an excess solder material, to thereby prevent short-circuit between the electrodes.

Further, in the above, description is given of the example in which three electrodes are included in the receiver module 1, but the number of electrodes may be arbitrary. It is only required to arrange the trap regions in accordance with the number of electrodes, to thereby prevent short-circuit between the electrodes due to the excess solder.

Further, in the above-mentioned embodiment and modified example, the semiconductor light receiving element 200 is exemplified as an element included in a device employing solder joining, the sub-mount 100 is exemplified as a wiring board of the device employing solder joining, and a technology according to the invention of this application is described with reference to, as an example, the device employing solder joining in which the semiconductor light receiving element is joined to a chip carrier with solder. The spirit of the invention of this application is not limited to the semiconductor light receiving element, and can be suitably applied to a case where an element having a problem as described in the above-mentioned embodiment and modified example is joined to a wiring board such as a chip carrier with solder. For example, such a case is conceivable where a highly integrated Si semiconductor element including a plurality of electrode pads arranged in high density is flip-chip mounted as an element.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A receiver module, comprising:
   a semiconductor light receiving element comprising an electrode; and
   a sub-mount comprising:
      an electrical wiring;
      a barrier metal disposed on a joining surface of the electrical wiring facing the electrode; and
      solder disposed on a surface of the barrier metal, and the electrical wiring is joined to the electrode by the solder with the barrier metal disposed therebetween,
   wherein the electrical wiring has a trap region disposed around the barrier metal, and the trap region retains melted solder by solder wetting on the electrical wiring,
   wherein a surface area of the electrode joined to the electrical wiring is smaller than a surface area of the barrier metal.

2. The receiver module according to claim 1,
   wherein the trap region contains a metal to be reacted with the solder to be alloyed.

3. The receiver module according to claim 2,
   wherein the electrode has a surface containing Au as a main component,
   wherein the solder comprises AuSn-based solder, and
   wherein the trap region has a surface containing Au.

4. The receiver module according to claim 1,
   wherein the barrier metal has a surface containing one of Pt and Pd.

5. The receiver module according to claim 1,
   wherein the semiconductor light receiving element comprises a plurality of electrodes,
   wherein the sub-mount comprises a plurality of electrical wirings,
   wherein each of the plurality of electrodes is joined to a corresponding one of the plurality of electrical wirings with solder, and
   wherein the trap region is respectively arranged around each of the plurality of electrical wirings to retain melted solder when the plurality of electrodes and the plurality of electrical wirings are joined to each other, thereby preventing the melted solder from joining between the plurality of electrodes and joining between the plurality of electrical wirings.

6. The receiver module according to claim 1,
   wherein the barrier metal prevents segregation of the solder which occurs when the electrode and the electrical wiring are joined to each other.

7. The receiver module according to claim 1,
   wherein the electrode of the semiconductor light receiving element has a surface layer containing Au,
   wherein the electrical wiring of the sub-mount is joined to the electrode with AuSn-based solder, and
   wherein the trap region of the sub-mount has a surface layer containing Au.

8. The receiver module according to claim 7, wherein the barrier metal has a surface layer containing one of Pt and Pd.

9. The receiver module according to claim 1, further comprising:
   an optical fiber for passing light from outside;
   a lens for causing the light that has passed through the optical fiber to enter the receiver module; and
   a lead pin for outputting a signal that has been photoelectrically converted by the receiver module.

10. The receiver module according to claim 1, wherein the joining surface of the electrical wiring does not contact the solder.

* * * * *